(12) United States Patent
Schimmel et al.

(10) Patent No.: US 9,671,698 B2
(45) Date of Patent: Jun. 6, 2017

(54) FUEL STREAM GENERATOR, SOURCE COLLECTOR APPARATUS AND LITHOGRAPHIC APPARATUS

(71) Applicant: ASML Netherlands B.V., Veldhoven (NL)

(72) Inventors: Hendrikus Gijsbertus Schimmel, Utrect (NL); Dzmitry Labetski, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 266 days.

(21) Appl. No.: 14/380,217

(22) PCT Filed: Jan. 22, 2013

(86) PCT No.: PCT/EP2013/051093
§ 371 (c)(1),
(2) Date: Aug. 21, 2014

(87) PCT Pub. No.: WO2013/124101
PCT Pub. Date: Aug. 29, 2013

(65) Prior Publication Data
US 2015/0029478 A1 Jan. 29, 2015

Related U.S. Application Data

(60) Provisional application No. 61/601,728, filed on Feb. 22, 2012.

(51) Int. Cl.
*G03F 7/20* (2006.01)
*B05B 1/02* (2006.01)
*H05G 2/00* (2006.01)

(52) U.S. Cl.
CPC ............ *G03F 7/70033* (2013.01); *B05B 1/02* (2013.01); *H05G 2/005* (2013.01); *H05G 2/006* (2013.01);
(Continued)

(58) Field of Classification Search
CPC . H05G 2/006; G03F 7/70033; G03F 7/70041; G03F 7/70166
See application file for complete search history.

(56) References Cited

U.S. PATENT DOCUMENTS

| 4,370,538 A | 1/1983 | Browning | |
| 6,189,803 B1 * | 2/2001 | Ganan-Calvo | B01F 5/04 123/531 |

(Continued)

FOREIGN PATENT DOCUMENTS

| EP | 1 150 169 A2 | 10/2001 |
| WO | WO 2011/082891 A1 | 7/2011 |

(Continued)

OTHER PUBLICATIONS

DePonte, D.P., et al., "Gas Dynamic Virtual Nozzle for Generation of Microscopic Droplet Streams," Journal of Physics D: Applied Physics, vol. 14, 2008; 12 pages.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

A fuel stream generator comprising a nozzle connected to a fuel reservoir, wherein the nozzle is provided with a gas inlet configured to provide a sheath of gas around fuel flowing along the nozzle is disclosed. Also disclosed are a method of generating fuel droplets and a lithography apparatus incorporating the fuel stream generator.

17 Claims, 2 Drawing Sheets

(52) U.S. Cl.
CPC ........ *H05G 2/008* (2013.01); *Y10T 137/0391* (2015.04); *Y10T 137/218* (2015.04)

(56) References Cited

U.S. PATENT DOCUMENTS

| | | | |
|---|---|---|---|
| 6,493,423 B1* | 12/2002 | Bisschops | G03F 7/70033 378/119 |
| 6,661,018 B1* | 12/2003 | McGregor | G03F 7/70033 250/492.22 |
| 6,924,600 B2* | 8/2005 | Mochizuki | G21B 1/23 315/111.21 |
| 2002/0151604 A1 | 10/2002 | Detering et al. | |
| 2003/0223546 A1* | 12/2003 | McGregor | H05G 2/003 378/143 |
| 2004/0114720 A1 | 6/2004 | Orsini et al. | |
| 2005/0140031 A1* | 6/2005 | Gerking | F02M 67/10 261/76 |
| 2005/0205810 A1* | 9/2005 | Akins | B82Y 10/00 250/504 R |
| 2006/0017026 A1* | 1/2006 | Hergenhan | H05G 2/003 250/504 R |
| 2006/0043319 A1* | 3/2006 | Gaebel | H05G 2/003 250/504 R |
| 2006/0192153 A1* | 8/2006 | Bykanov | H05G 2/003 250/503.1 |
| 2010/0053581 A1* | 3/2010 | Swinkels | G03F 7/70033 355/53 |
| 2010/0200776 A1 | 8/2010 | Yabu et al. | |
| 2010/0243753 A1 | 9/2010 | Doak et al. | |
| 2011/0229649 A1 | 9/2011 | Baranovski et al. | |

FOREIGN PATENT DOCUMENTS

| | | |
|---|---|---|
| WO | WO 2011/116898 A1 | 9/2011 |
| WO | WO 2011/150368 A1 | 12/2011 |

OTHER PUBLICATIONS

International Search Report directed to related International Patent Application No. PCT/EP2013/051093, mailed Aug. 21, 2013; 4 pages.

International Preliminary Report on Patentability and Written Opinion of the International Searching Authority directed to related International Patent No. PCT/EP2013/051093, issued Aug. 26, 2014; 8 pages.

* cited by examiner

FUEL STREAM GENERATOR, SOURCE COLLECTOR APPARATUS AND LITHOGRAPHIC APPARATUS

CROSS-REFERENCE TO RELATED APPLICATIONS

This application claims the benefit of U.S. provisional application 61/601,728, which was filed on Feb. 22, 2012, and which is incorporated herein in its entirety by reference.

FIELD

The present invention relates to a fuel stream generator, to a source collector apparatus and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

It may be difficult to deliver to a plasma formation location droplets of fuel material having a desired size and a desired separation.

It is desirable to provide a fuel stream generator that is novel and inventive compared with known radiation sources.

SUMMARY

According to an aspect of the invention, there is provided a fuel stream generator comprising a nozzle connected to a fuel reservoir, wherein the nozzle is provided with a gas inlet configured to provide a sheath of gas that constricts fuel flowing along the nozzle.

The gas inlet may be configured to provide gas around a circumference of the nozzle.

The gas inlet may extend circumferentially around the nozzle.

The gas inlet may be a single opening in the form of a ring.

The gas inlet may comprise a plurality of openings.

The plurality of openings may be provided as a ring that extends circumferentially around the nozzle.

At least one of the openings of the plurality of openings may be axially displaced relative to other openings.

The gas inlet may be located between a first section and an end section of the nozzle.

The nozzle may comprise an inner portion and an outer portion, and the gas inlet may extend between the inner portion and the outer portion of the nozzle.

The gas inlet may be configured to introduce at least some gas at an acute angle relative to an axial line that extends from an outlet of the nozzle to the gas inlet.

The gas inlet may be configured to introduce at least some gas perpendicularly or at an obtuse angle relative to an axial line that extends from an outlet of the nozzle to the gas inlet.

An inner diameter of the nozzle may be 5 microns or more.

An inner diameter of the nozzle may be 10 microns or more.

According to a second aspect of the invention there is provided a source collector apparatus comprising the fuel stream generator of the first aspect of the invention, further comprising a plasma formation location arranged to receive fuel droplets from the fuel stream generator and to receive a laser beam configured to vaporize the fuel droplets to form a plasma, and a collector configured to collect and reflect radiation emitted by the plasma.

According to a third aspect of the invention there is provided a lithographic apparatus comprising the source collector apparatus of the second aspect of the invention and further comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

According to a fourth aspect of the invention there is provided a method of generating fuel droplets, the method comprising providing fuel under pressure in a reservoir such that the fuel flows into and along a nozzle, the method further comprising introducing gas into the nozzle to form sheath of gas around the fuel flowing along the nozzle.

According to a fifth aspect of the invention there is provided a fuel stream generator comprising a nozzle connected to a fuel reservoir, wherein the nozzle is provided with a gas inlet configured to provide gas that constricts the tin stream and prevents the tin stream from coming into contact with an inner wall of the nozzle.

Further features and advantages as well as the structure and operation of various embodiments are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
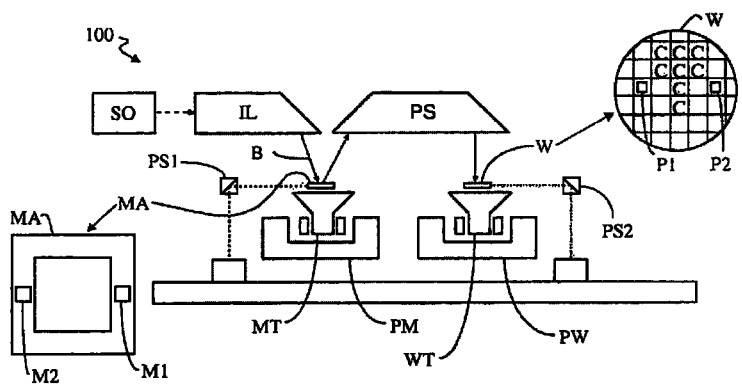
FIG. 1 schematically depicts a lithographic apparatus according to an embodiment of the invention.

Embodiments are described below with reference to the accompanying drawings. In the drawings, like reference numbers generally refer to identical or functionally similar elements. Additionally, the leftmost digit(s) of a reference number generally identifies the drawing in which the reference number first appears.

DETAILED DESCRIPTION

It is noted that reference in this specification to "one embodiment," "an embodiment," "an example embodiment," etc., indicate that the embodiment described may include a particular feature, structure, or characteristic, but not every embodiment may necessarily include the particular feature, structure, or characteristic. Moreover, such phrases are not necessarily referring to the same embodiment. Further, when a particular feature, structure, or characteristic, is described in connection with an embodiment, it is submitted that it is within the knowledge of one skilled in the art to effect such feature, structure, or characteristic, in connection with other embodiments whether or not explicitly described.

FIG. 1 schematically depicts a lithographic apparatus 100 including a source collector apparatus SO according to one embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PSI can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
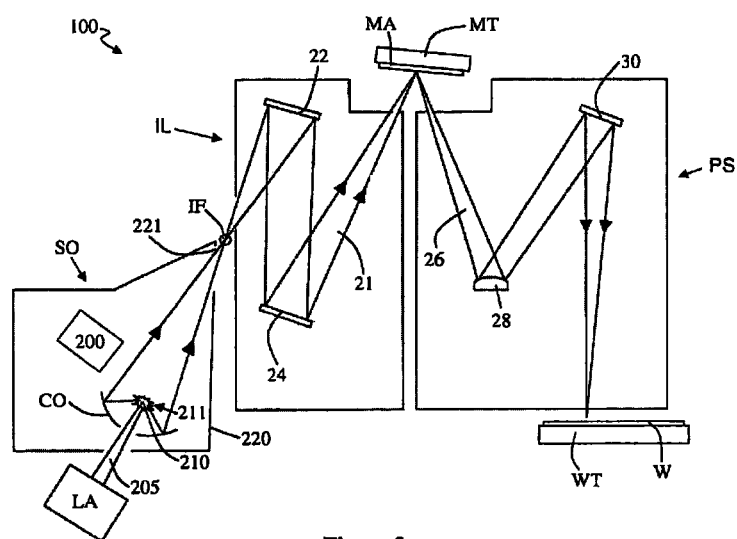
FIG. 2 is a more detailed view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. A laser LA is arranged to deposit laser energy via a laser beam 205 into a fuel, such as xenon (Xe), tin (Sn) or lithium (Li), which is provided from a fuel stream generator 200. This creates a highly ionized plasma 210 at a plasma formation location 211 that has electron temperatures of several 10's of eV. The energetic radiation generated during de-excitation and recombination of these ions is emitted from the plasma, collected and focused by a near normal incidence radiation collector CO.

Radiation that is reflected by the radiation collector CO is focused at a virtual source point IF. The virtual source point IF is commonly referred to as the intermediate focus, and the source collector module SO is arranged such that the intermediate focus IF is located at or near to an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

A conventional fuel stream generator may comprise a reservoir in which liquid fuel is held at pressure and a nozzle. As a result of the pressure a stream of fuel issues from the nozzle. The stream of fuel naturally breaks up after travelling a distance from the nozzle (the distance being for example 100-1000 times the diameter of the nozzle), thereby forming a stream of droplets. This is referred to as Rayleigh break-up. When Rayleigh break-up occurs, fuel droplets are formed with a diameter that is around twice the diameter of the nozzle or slightly less than this, and with a separation around 4.5 times the diameter of the nozzle. A fuel stream generator may be designed such that fuel droplets coalesce together to form larger fuel droplets, for example having a diameter of around 20 microns.

When the laser beam 205 is incident upon a fuel droplet (e.g., a tin droplet) it vaporises the tin to form an EUV radiation emitting plasma (as discussed further above). However, vaporisation of the tin may be incomplete, and as a result particles of tin may remain after the EUV radiation has been generated. The tin particles may accumulate upon surfaces within the source collector apparatus SO and may reduce the efficiency of the source collector apparatus or even prevent it from operating altogether. Therefore, it may be desirable to maximise the proportion of a tin droplet that is vaporised by a laser. It has been found that the diameter of the tin droplet has a significant effect upon the extent to which a fuel droplet is vaporised by the laser beam 205. If the tin droplet is too big then a substantial proportion of the fuel droplet will not be vaporised by the laser beam, and tin will build up inside the source collector apparatus SO.

It has been found that that a nozzle having a diameter of around 3-4 microns will provide tin droplets having a desired diameter (e.g., a diameter of around 20 microns following droplet coalescence). This may allow more complete vaporisation of the tin droplets than would be the case if larger tin droplets were provided from the fuel stream generator 200. Furthermore, it has been found that a nozzle having a diameter of around 3-4 microns may allow tin droplets to be generated with a desired speed (e.g., around 100 m/s) and a desired separation (e.g., 1 mm).

A problem associated with using a nozzle having a diameter of around 3-4 microns is that the nozzle may become blocked due to its narrow diameter. The narrow diameter of the nozzle may make it particularly susceptible to blockage, for example by pieces of contamination that have entered the tin reservoir. Blockage of the nozzle is extremely undesirable because it interrupts operation of the EUV lithographic apparatus. It may be necessary to replace the fuel stream generator. This may take a significant period of time, and further time will be required in order to allow a vacuum to be re-established in the EUV lithographic apparatus after the nozzle has been unblocked. A nozzle that is susceptible to blockage may thus significantly reduce the throughput of an EUV lithographic apparatus.

Embodiments of the invention address the above problem. In an embodiment of the invention, a fuel stream generator is provided with a nozzle that is configured to provide a flow of gas, which surrounds fuel travelling along the nozzle, the flow of gas acting to limit the diameter of the fuel as it travels along the nozzle. The gas may be used to ensure that the stream of fuel exits the nozzle with a desired diameter. Because the gas limits the diameter of the fuel as it flows along the nozzle, this allows the nozzle to have a greater diameter than would be the case if the gas were not used. Increasing the diameter of the nozzle is advantageous because it reduces the likelihood that the nozzle will become blocked.

Figure 3:
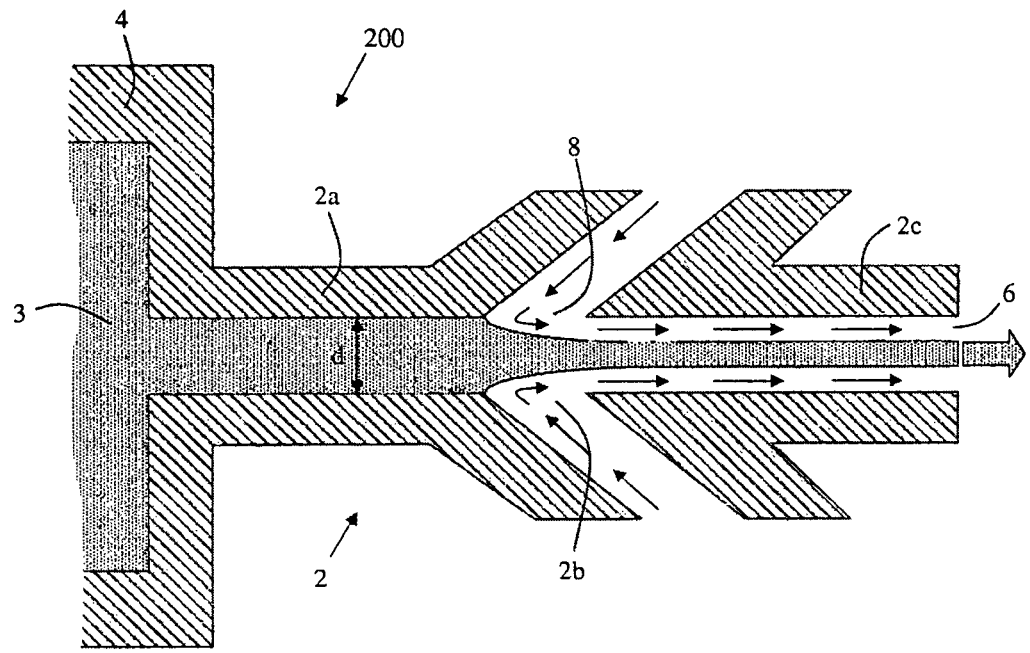
FIG. 3 schematically depicts part of a fuel stream generator that forms part of a source collector apparatus of the lithographic apparatus of FIGS. 1 and 2.

FIG. 3 shows schematically in cross-section a nozzle 2 of a fuel stream generator 200 according to an embodiment of the invention. In this embodiment the fuel is tin (other fuels may be used). One end of the nozzle 2 is connected to a fuel reservoir 4, and an opposite end of the nozzle is provided with an outlet 6 through, which tin may be projected from the nozzle. A gas inlet 8 is connected to the nozzle 2 partway along the nozzle. The gas inlet 8 extends circumferentially around the nozzle. The gas inlet 8 subtends an acute angle relative to an axial line, which extends from the outlet 6 to the gas inlet. The gas inlet 8 is configured to introduce the gas into the nozzle at an acute angle relative to the axial line.

The nozzle 2 has an inner diameter d that may be significantly larger than the inner diameter of a nozzle of a conventional fuel stream generator. For example, the nozzle may have an inner diameter that is greater than 3-4 microns. For example, the nozzle may have a diameter of 5 microns or more, 10 microns or more, or 20 microns or more. For example the nozzle may have a diameter of up to 50 microns.

The skilled person would expect that using a nozzle with an inner diameter of 10 microns or more would be disadvantageous because it would tend to generate fuel droplets that are too large to be vaporized efficiently by a laser beam and would hence give rise to a large amount of contamination. The skilled person would also expect that it would not be possible to issue the droplets from the nozzle with a sufficiently high speed, and that consequently the separation between consecutive droplets would be too small. Embodiments of the invention allow a nozzle to be used with an inner diameter of 10 microns or more whilst at the same time avoiding these disadvantages.

In use, tin 3 is held in the reservoir 4 under pressure and at a temperature that is sufficiently high that the tin is in a liquid form. The pressure in the reservoir 4 may for example be provided by a gas such as argon that is supplied to the reservoir under pressure. The pressure within the reservoir 4 causes tin to flow from the reservoir into the nozzle 2 and out of the outlet 6. In a first section 2a of the nozzle the tin 3 occupies the full diameter of the nozzle, as is shown schematically in FIG. 3. The tin thus has a diameter that corresponds with the inner diameter of the nozzle (e.g., 10 microns).

The flow of gas that is provided through the gas inlet 8 is represented schematically by arrows. The gas is received at a middle section 2b of the nozzle and is provided around the circumference of the nozzle. The gas is incident upon tin flowing from the first section 2a to the middle section 2b of the nozzle, and effectively forms a wall that prevents the tin from continuing to flow as a stream with a diameter equal to the inner diameter of the nozzle. The pressure of the gas is not sufficient to completely block flow of the tin. Instead, the tin continues to flow out of the nozzle but flows as a stream with a reduced diameter (as is represented schematically in FIG. 3). The gas thus constricts the tin stream such that as the tin passes from the first section 2a to the middle section 2b of the nozzle the diameter of the tin stream is reduced. The gas forms a sheath around the tin as it flows through an end section 2c of the nozzle. The gas thus limits the diameter of the tin stream as it flows through the end section 2c of the nozzle.

The gas allows the diameter of the tin stream delivered from the outlet 6 of the nozzle 2 to be controlled. In particular, the gas allows the tin stream to be generated with a diameter that is significantly less than the diameter of the outlet 6, and therefore allows a tin stream with a desired diameter to be generated using a nozzle that has an inner diameter greater than the desired tin stream diameter. This allows the nozzle to be provided with a diameter that is greater than the diameter of a conventional nozzle, thereby making the nozzle less susceptible to blockage by contamination. This may allow the lithographic apparatus to be run with a higher throughput, since stoppages of the lithographic apparatus to remove blockages may be reduced or eliminated.

The pressure of gas provided through the gas inlet 8 may be modified to control the diameter of the tin stream in the end section 2c of the nozzle. The pressure of gas may for example be controlled by a control apparatus (not illustrated). This control may be automated in order to provide a tin stream and/or tin droplets of desired diameters. For example, if it is desired to reduce the diameter of the tin stream in the end section 2c of the nozzle then the pressure of the gas may be increased. Similarly, if it is desired to increase the diameter of the tin stream in the end section 2c of the nozzle the pressure of the gas provided through the gas inlet 8 may be reduced.

In the embodiment shown in FIG. 3 the gas inlet 8 subtends an acute angle relative to an axial line that extends from the outlet 6 to the gas inlet. The gas is therefore flowing in a direction that includes a component that is opposite to the direction of flow of the tin when the gas enters the nozzle 2. The pressure applied by the gas to the tin stream when the gas enters the nozzle is a combination of static pressure (i.e., pressure of gas without taking into account the direction of gas flow) and dynamic pressure (i.e., pressure arising from the direction of gas flow). The dynamic pressure is considerable because the gas exerts force on the tin as the direction of flow of the gas is partially reversed (the gas changes from flowing in a direction that has a component opposite to the direction of flow of the tin to flowing in the same direction as the tin). This bending of the direction of flow of the gas provides force that helps to constrict the tin stream.

The dynamic pressure provided from the inlet configuration shown in FIG. 3 allows the gas to constrict the tin stream more effectively than would be the case if no dynamic pressure were to be exerted on the tin stream. For example, if the gas were to be introduced into the nozzle perpendicularly to the direction of flow of the tin with the same rate of gas flow, the constriction of the tin stream provided by the gas flow would be reduced.

As mentioned further above, when the tin stream is flowing along the end section 2c of the nozzle the gas surrounds the tin stream and provides a barrier between the tin stream and the interior of the nozzle. Because the tin stream is not in contact with the interior of the nozzle 2, friction that would occur between the tin and the interior of the nozzle does not occur.

Because the gas is flowing with the tin stream, viscous resistance between the tin stream and the gas may be low. The gas may be considered to lubricate the flow of the tin stream. Because viscous resistance between the tin stream and the interior wall of the nozzle 2 does not occur, the tin stream will leave the outlet 6 with a velocity that is greater than the velocity that would be seen if the tin stream were to be in contact with the interior wall of the nozzle (for a given diameter of tin stream). Therefore, a desired tin stream velocity may be obtained using a lower pressure in the reservoir 4.

The gas may be considered to form a moving wall that moves in the same direction as the tin stream. The gas may include a velocity gradient, the velocity of the gas being highest adjacent to the tin stream and being lowest adjacent to the interior wall of the nozzle 2. The moving wall provided by the gas may help to reduce the likelihood that a contamination particle will block the nozzle 2, because the moving wall provided by the gas (together with the flow of the tin stream) will tend to draw the contamination particle to the outlet 6, from where the contamination particle will leave the nozzle.

If a contamination particle were to become lodged in the nozzle 2, e.g., at the location where the diameter of the tin stream is restricted by the gas, then the flow of gas through the gas inlet 8 could be temporarily interrupted (or the pressure of the gas reduced). This will remove or reduce the constricting effect of the gas, thereby improving the likelihood that the contamination particle will flow along the nozzle 2 and out of the outlet 6.

The gas may accelerate as it flows through the end section 2c of the nozzle, because the pressure beyond the outlet 6 of the nozzle is lower than the pressure of gas within the nozzle. The gas may for example accelerate to around 500 m/s. The gas may accelerate to a speed that is faster than the speed of flow of the tin stream. Where this is the case, the gas may cause the tin stream to be accelerated. This may be via acceleration of an outer portion of the tin stream, which will accelerate the entire tin stream due to viscosity within the tin stream.

In an embodiment, the gas inlet may be arranged such that it subtends an obtuse angle relative to an axial line that extends from the outlet 6 to the gas inlet 8. The gas inlet 8 may be configured to introduce the gas into the nozzle at an obtuse angle relative to the axial line, such that gas is introduced into the nozzle flowing in a direction that includes a component along the direction of flow of the tin stream. Where this is the case, the constricting effect provided by the gas may be less than the constricting effect provided when the gas subtends an acute angle. However, the gas may accelerate the tin stream to a greater degree.

In an embodiment, the gas inlet 8 may be arranged such that it is substantially perpendicular to an axial line that extends from the outlet 6 to the gas inlet 8 (and hence introduces gas into the nozzle perpendicularly to the axial line).

The gas inlet 8 may be configured such that it has a greater cross-sectional area than the cross-sectional area of the nozzle 2. When this configuration is used, the greatest restriction experienced by the gas is in the nozzle. Consequently, the gas inlet 8 does not have a significant effect upon the extent to which the pressure of gas delivered to the nozzle can be adjusted. The gas inlet 8 may be configured such that it has a greater cross-sectional area than the cross-sectional area occupied by the gas in the nozzle 2 during normal operation of the nozzle. Again, where this is the case the gas inlet 8 does not have a significant effect upon the extent to which the pressure of gas delivered to the nozzle can be adjusted.

The length of the gas inlet 8 (in the axial direction) may for example be around 20-30 microns. The length of the gas inlet (in the axial direction) may be any suitable value.

Although in the nozzle shown in FIG. 3 the first section 2a and the end section 2c of the nozzle have the same internal diameter, it is not necessary that this is the case. For example, the first section of the nozzle may have a smaller internal diameter than the end section of the nozzle (or vice versa). For example, the first section of the nozzle may have a diameter of around 10 microns and the end section of the nozzle may have a diameter of around 20 microns.

Figure 4:
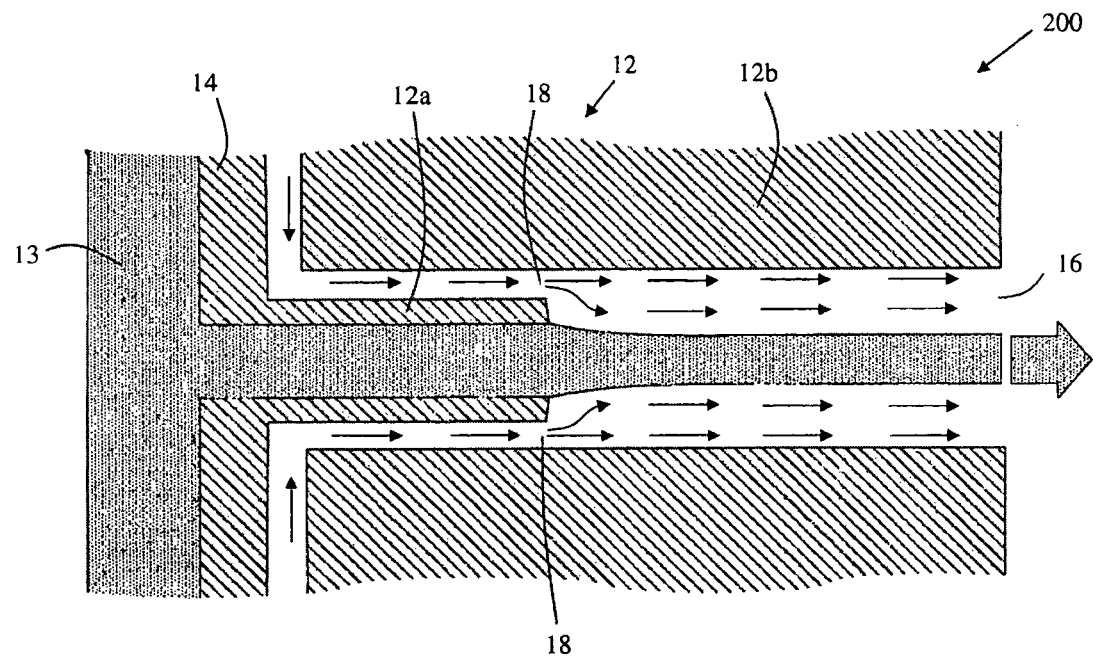
FIG. 4 schematically depicts part of an alternative embodiment of the fuel stream generator.

FIG. 4 shows schematically in cross-section part of a fuel stream generator 200 according to an alternative embodiment of the invention. A nozzle 12 comprises an inner portion 12a, which is connected to a fuel reservoir 14, and an outer portion 12b, which has an outlet 16 through which to may be projected from the nozzle. The inner portion 12a of the nozzle does not extend as far as the outlet 16, extending only partway within the outer portion 12b of the nozzle. A gas inlet 18 extends between the inner portion 12a and the outer portion 12b of the nozzle. The gas inlet 18 is configured to deliver gas into the nozzle 12 such that the gas forms a sheath of gas around a tin stream delivered from the inner portion 12a of the nozzle and constricts fuel flowing through the outer portion 12b of the nozzle. In this embodiment the gas inlet extends circumferentially around the inner portion 12a of the nozzle. In this embodiment the gas inlet 18 is arranged such that gas flows along the exterior of the inner portion 12a of the nozzle before entering the outer portion 12b of the nozzle. The flow of gas is represented schematically by arrows in FIG. 4. As is represented, the gas constricts the tin as it flows out of the inner portion 12a of the nozzle and into the outer portion 12b of the nozzle. The diameter of the fuel stream as it flows through the outer portion 12b of the nozzle is thus smaller than the inner diameter of the inner portion 12a of the nozzle. The diameter of the fuel stream as it flows through the outer portion 12b of the nozzle is also smaller than the inner diameter of the outer portion of the nozzle.

In common with the embodiment shown in FIG. 3, the embodiment of FIG. 4 allows a tin stream to delivered from the fuel stream generator 200 that has a diameter that is less than the inner diameter of the nozzle 12 (in this instance less than the inner diameter of both the inner and outer portions 12a,b of the nozzle). The nozzle 12 may consequently be provided with a diameter that is larger than the diameter of a conventional fuel stream generator nozzle, thus making the nozzle less susceptible to blockage. The diameter of the fuel stream provided from the outlet 16 of the nozzle 12 may be controlled by controlling the pressure of gas delivered through the gas inlet 18.

In an embodiment, the nozzle 2, 12 may have a length of around 0.5 mm. The nozzle may have any suitable length.

There may for example be a ratio of around 5-6 between the inner diameter of the end section 2c of the nozzle (or the inner diameter of the nozzle outer portion 12b) and the diameter of the tin stream. A ratio such as this (or a smaller ratio) may allow the tin stream to be generated and emitted from the outlet 6, 16 in a stable manner. Thus, the ratio may be up to around 6-5.

In an embodiment, the inner diameter of the end section 2c of the nozzle may taper inwardly (i.e., growing narrower along the direction of flow of the fuel stream) or may taper outwardly (i.e., growing wider along the direction of flow of the fuel stream). Similarly, the inner diameter of the nozzle outer portion 12b may taper inwardly or may taper outwardly. Where this is the case, the inner diameter referred to in the above ratio may be the minimum inner diameter of the end section 2c of the nozzle or the minimum inner diameter of the nozzle outer portion 12b.

In an embodiment, the inner diameter of the end section 2c of the nozzle may be substantially constant. In an embodiment, the inner diameter of the nozzle outer portion 12b may be substantially constant.

The flow of gas may be for example around 1 Pam³/s. This flow is sufficiently low that it will not compromise operation of the source collector apparatus SO.

In an embodiment, an actuator such as a piezo-electric actuator may be provided at the nozzle and may be used to modulate the nozzle to promote the generation of tin droplets by the nozzle. The piezo-electric modulator may for example be provided at the first section 2a or inner portion 12a of the nozzle and arranged to modulate the diameter of that part of the nozzle. In an embodiment, the pressure of the gas may be modulated to promote the generation of tin droplets by the nozzle (in addition to or instead of modulating using an actuator). The pressure of the gas may be modulated by modulating pressure in the supply of gas to the gas inlet 8, 18. Alternatively, the pressure of the gas may be modulated by modulating the end section 2c of the nozzle (or the outer portion 12b of the nozzle), e.g., by using an actuator to modulate the diameter of the end section and thereby modulate the gas pressure. The modulation of the gas pressure may be such that constriction of the tin stream increases and decreases but the tin stream flows continuously along the nozzle. The modulation of the gas pressure may alternatively be such that flow of the tin stream is periodically interrupted. When this is done, the tin stream will have the form of cylinders of tin that propagate along the nozzle, the cylinders of tin being surrounded in a radial direction by a sheath of gas. The gas thus constricts the tin stream as it travels along the nozzle (i.e., it constricts the cylinders of tin). The axial length of the cylinders of tin may be controlled by controlling the modulation frequency of the gas pressure modulation.

A nozzle 2, 12 according to an embodiment of the invention may be easier to fabricate than some conventional nozzles, because it has a significantly greater inner diameter (it may be difficult for example to fabricate a nozzle having an inner diameter of 3-4 microns).

The above description refers to the gas inlet 8 extending circumferentially around the nozzle 2. This is not intended to mean that the gas inlet 8 extends entirely uninterrupted around the interior wall of the nozzle 2. The gas inlet may comprise a plurality of openings. Structural elements that connect the first section 2a of the nozzle to the end section 2c of the nozzle may for example be provided between the openings. The plurality of openings may be arranged in a ring-type pattern around the interior wall of the nozzle. One or more of the openings of the plurality of openings may be axially displaced (i.e., closer to or further from the reservoir 4) relative to other openings. The gas inlet may have any suitable configuration that provides a sheath of gas around the tin stream that constricts the tin stream (e.g., constricts the tin stream in a radial direction). The gas inlet may be configured to provide gas that encircles the tin stream and prevents the tin stream from coming into contact with an inner wall of the nozzle. The gas provided from the gas inlet may be arranged such that fuel that passes from the outlet 6 has a diameter, which is significantly less than the inner diameter of the outlet.

The above description refers to the gas inlet 18 extending circumferentially around the inner portion 12a of the nozzle 12. This is not intended to mean that the gas inlet 18 extends entirely uninterrupted around the end of the inner portion 12a of the nozzle 12. The gas inlet may comprise a plurality of openings. The plurality of openings may be arranged in a ring at the outer end of the inner portion 12a of the nozzle. One or more of the openings of the plurality of openings may be axially displaced (i.e., closer to or further from the reservoir 4) relative to other openings. The gas inlet may have any suitable configuration that provides a sheath of gas around the tin stream that constricts the tin stream. The gas inlet may be configured to provide gas that encircles the tin stream and prevents the tin stream from coming into contact with an inner wall of the outer portion 12b of the nozzle. The gas provided from the gas inlet may be arranged such that fuel that passes from the outlet 6 has a diameter that is significantly less than the inner diameter of the outer portion 12b of the outlet.

The gas inlet 8, 18 may be arranged to deliver gas at an acute angle, obtuse angle, or perpendicular to a line extending from the outlet 6, 16 to the gas inlet (the line being parallel to the direction of flow of the tin stream). In embodiments in which a plurality of openings 8, 18 are provided, one or more openings may be arranged to deliver gas at an acute angle, with one or more openings being arranged to deliver gas at an obtuse angle (or perpendicular). Similarly, one or more openings may be arranged to deliver gas at an obtuse angle, with one or more openings being arranged to deliver gas at an acute angle (or perpendicular).

The pressure of the gas provided at the gas inlet 8, 18 may be controlled by a controller (not illustrated). The controller may control the gas pressure in an automated manner (e.g., taking into account feedback derived from sensors in the source collector apparatus SO or in other parts of the lithographic apparatus). In embodiments in which the gas pressure is modulated, the modulation may be controlled by a controller (not illustrated). The controller may apply modulation in an automated manner (e.g., taking into account feedback from sensors).

Although the embodiment of the invention has been described in relation to liquid tin, the invention may be used in connection with any suitable fuel.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A fuel stream generator of a source collector apparatus having a plasma-forming fuel reservoir, the fuel stream generator comprising a nozzle connected to the fuel reservoir, wherein the nozzle has a gas inlet configured to provide a sheath of gas that constricts fuel flowing along the nozzle such that a diameter of the fuel is reduced.

2. The fuel stream generator of claim 1, wherein the gas inlet is configured to provide gas around a circumference of the nozzle.

3. The fuel stream generator of claim 1, wherein the gas inlet extends circumferentially around the nozzle.

4. The fuel stream generator of claim 3, wherein the gas inlet is a single opening in the form of a ring.

5. The fuel stream generator of claim 1, wherein the gas inlet comprises a plurality of openings.

6. The fuel stream generator of claim 5, wherein the plurality of openings are provided in ring-type pattern that extends circumferentially around the nozzle.

7. The fuel stream generator of claim 5, wherein at least one of the openings of the plurality of openings is axially displaced relative to other openings.

8. The fuel stream generator of claim 1, wherein the gas inlet is located between a first section and an end section of the nozzle.

9. The fuel stream generator of claim 1, wherein the nozzle comprises an inner portion and an outer portion, and wherein the gas inlet extends between the inner portion and the outer portion of the nozzle.

10. The fuel stream generator of claim 1, wherein the gas inlet is configured to introduce at least some gas at an acute angle relative to an axial line that extends from an outlet of the nozzle to the gas inlet.

11. The fuel stream generator of claim 1, wherein the gas inlet is configured to introduce at least some gas perpendicularly or at an obtuse angle relative to an axial line that extends from an outlet of the nozzle to the gas inlet.

12. The fuel stream generator of claim 1, wherein an inner diameter of the nozzle is 5 microns or more.

13. The fuel stream generator of claim 12, wherein an inner diameter of the nozzle is 10 microns or more.

14. A source collector apparatus comprising:
a fuel stream generator comprising a nozzle connected to a fuel reservoir, wherein the nozzle has a gas inlet configured to provide a sheath of gas that constricts fuel flowing along the nozzle;
a plasma formation location arranged to receive fuel droplets from the fuel stream generator and to receive a laser beam configured to vaporize the fuel droplets to form a plasma, and
a collector configured to collect and reflect radiation emitted by the plasma.

15. A lithographic apparatus, comprising:
a source collector apparatus comprising:
a fuel stream generator having a nozzle connected to a fuel reservoir, wherein the nozzle has a gas inlet configured to provide a sheath of gas that constricts fuel flowing along the nozzle such that a diameter of the fuel is reduced, and
a plasma formation location arranged to receive fuel droplets from the fuel stream generator and to receive a laser beam configured to vaporize the fuel droplets to form a plasma, and a collector configured to collect and reflect a radiation beam emitted by the plasma;
an illumination system configured to condition the radiation beam;
a support constructed to support a patterning device, the patterning device being capable of imparting the radiation beam with a pattern in its cross-section to form a patterned radiation beam;
a substrate table constructed to hold a substrate; and a projection system configured to project the patterned radiation beam onto a target portion of the substrate.

16. A method of generating fuel droplets, comprising:
providing fuel under pressure in a reservoir such that the fuel flows into and along a nozzle;
introducing gas into the nozzle to form a sheath of gas around the fuel flowing along the nozzle such that a diameter of the fuel is reduce;
exciting the fuel with a laser to produce radiation-emitting plasma; and
collecting and reflecting radiation emitted by the plasma using a source collector.

17. A fuel stream generator comprising a nozzle connected to a fuel reservoir, wherein the nozzle is provided with a gas inlet configured to provide gas that constricts a tin stream such that a diameter of the tin stream is reduced, thereby preventing the tin stream from coming into contact with an inner wall of the nozzle.

* * * * *